United States Patent [19]

Kamiya et al.

[11] Patent Number: 4,794,433
[45] Date of Patent: Dec. 27, 1988

[54] NON-VOLATILE SEMICONDUCTOR MEMORY WITH NON-UNIFORM GATE INSULATOR

[75] Inventors: Masaaki Kamiya; Yoshikazu Kojima, both of Tokyo, Japan

[73] Assignee: Kabushiki Kaisha Daini Seikosha, Tokyo, Japan

[21] Appl. No.: 831,064

[22] Filed: Feb. 19, 1986

Related U.S. Application Data

[63] Continuation of Ser. No. 430,989, Sep. 30, 1982, abandoned.

[30] Foreign Application Priority Data

Oct. 1, 1981 [JP] Japan .................................. 56-157044

[51] Int. Cl.$^4$ ............................................. H01L 29/78
[52] U.S. Cl. ..................... 357/23.5; 357/45; 357/23.14; 357/23.9; 357/23.12
[58] Field of Search .................. 357/23.1, 23.5, 23.9, 357/23.12, 23.14, 23.15, 45, 46

[56] References Cited

U.S. PATENT DOCUMENTS

| | | | |
|---|---|---|---|
| 3,439,236 | 4/1969 | Bucher | 357/23.12 X |
| 3,714,522 | 1/1973 | Komiya et al. | 357/23.14 |
| 3,767,983 | 10/1973 | Berglund | 357/23.1 X |
| 4,103,344 | 7/1978 | Fagan et al. | 357/23.5 X |
| 4,203,158 | 5/1980 | Frohman-Bentchkowsky et al. | 357/23.5 X |
| 4,409,723 | 10/1983 | Harari | 357/23.5 X |
| 4,425,631 | 1/1984 | Adam | 357/23.5 X |
| 4,442,447 | 4/1984 | Ipri et al. | 357/23.5 X |
| 4,558,339 | 12/1985 | Angle | 357/23.5 |
| 4,589,009 | 5/1986 | Motameri | 357/23.5 X |
| 4,615,020 | 9/1986 | Rinerson et al. | 357/23.5 X |

FOREIGN PATENT DOCUMENTS

| | | | |
|---|---|---|---|
| 55-111173 | 8/1980 | Japan | 357/23.5 |
| 57-180182 | 11/1982 | Japan | 357/23.5 |
| 2059680 | 4/1981 | United Kingdom | 357/23.5 |

OTHER PUBLICATIONS

Chang et al., "Dynamic One-Device Storage Cell with Nonvolatile Backup Mode," *IBM Technical Disclosure Bulletin*, vol. 11, No. 3, Aug. 1975, pp. 561–652.

Verwey, "Atmos.-An Electrically Reprogrammable Read-Only Memory Device, IEEE Transactions on Electron Devices," vol. F26 -21, No. 10, Oct. 74, pp 631–635.

*Primary Examiner*—Andrew J. James
*Assistant Examiner*—William A. Mintel
*Attorney, Agent, or Firm*—Bruce L. Adams; Van C. Wilks

[57] ABSTRACT

A non-volatile semiconductor memory device has source and drain regions disposed in spaced apart relation adjacent the surface of a semiconductor substrate to define in the substrate a channel region having a first channel region portion in contract with the drain region and a second channel region portion between the first channel region portion and the source region. A floating gate electrode is disposed over the channel region between the source and drain regions, and a gate insulating layer is disposed between the channel region and the floating gate electrode. A writing drain voltage of one polarity is applied to the drain region and a writing floating gate voltage of the same polarity is applied by capacitance coupling to the floating gate electrode in order to more strongly invert the first channel region portion and more weakly invert the second channel region portion relative to one another to effect the injection of electric charges which comprise part of the channel current into the floating gate electrode from a position where the first channel region portion under strong inversion is in contact with the second channel region portion under weak inversion, the position being more distant from the drain region than the width of a depletion layer under the drain region formed between the drain region and the semiconductor substrate.

4 Claims, 3 Drawing Sheets

NON-VOLATILE SEMICONDUCTOR MEMORY WITH NON-UNIFORM GATE INSULATOR

This is a continuation of application Ser. No. 430,989, filed Sept. 30, 1982 now abandoned.

BACKGROUND OF THE INVENTION

The present invention relates to a non-volatile semiconductor memory capable of writing at a low voltage and a low current.

A conventional channel injection-type non-volatile semiconductor memory is disadvantageous in writing efficiency and requires a large current and large voltage for writing. The reason for the above disadvantage will be illustrated in conjunction with a sectional view of a conventional channel injection-type non-volatile semiconductor memory shown in FIG. 1.

In FIG. 1, a P-type semiconductor substrate 5 comprises an N+ type source region 3 and drain region 4 near the surface, an insulator layer 7 such as a silicon oxidation layer or nitride layer formed on a channel region between the source 3 and the drain 4, a floating gate electrode 2 for storing electric charges as information formed on the insulator layer 7, an insulator layer 6 formed on the floating gate electrode 2, and a control gate electrode 1 formed on the insulator layer 6. In the N-channel type non-volatile semiconductor memory, when a voltage VCG which is positive relative to the substrate 5 is applied to the control gate electrode 1 to invert the surface of the substrate 5, and a positive voltage is applied to the drain region 4, negatively charged electrons e$^-$ are accelerated near the drain region 4 as shown in FIG. 1. And when the electrons acquire sufficient energy to pass over the electric potential barrier of the insulator 7, the electrons can be injected into the floating gate electrode 2. As the electrons approach the drain, fewer are injected into the floating gate electrode 2 and more remain inside the semiconductor. The electrons injected into the floating gate electrode 2 are a part of the high energy electrons produced by collisons of the accelerated electrons inside the electric field of the depletion layer extended by the drain voltage VD near the drain with silicon atoms inside the silicon crystal. Among the high energy electrons produced by the collisions, only the electrons scattered in the direction of the floating gate electrode 2 can be injected into the floating gate electrode 2. The other high energy electrons flow into the drain region 4 that has a low energy level relative to the electrons. Namely, an exceedingly small number of electrons are injected into the floating gate electrode 2 out of the total channel current flowing from the source region 3. The rate of the injected electrons is generally $10^{-10}$–$10^{-8}$. Accordingly, to compensate for the low injection efficiency, the conventional non-volatile semiconductor memory as shown in FIG. 1 has injected the electrons necessary for acting as memory by the following methods:

(1) The channel current has been enlarged to increase injection electrons.

(2) The drain voltage has been raised to increase the electric field of the depletion layer near the drain and to increase the impact ionization.

(3) The injecting period has been prolonged to inject the necessary electrons into the floating gate electrode 2.

As understood from the above (1)–(3) methods, however, it is difficult to improve the integration degree of the memory and to write at high speed since the conventional memory necessitates a large current, a large voltage and a long time to write information on the memory.

BRIEF SUMMARY OF INVENTION

Accordingly, it is an object of the present invention to provide a non-volatile semiconductor memory suitable for high-integration of the memory and high-speed writing, by increasing the injection efficiency of electrons into a floating gate electrode.

These and other objects, features and advantages of the invention will become more apparent upon a reading of the following detailed specification and drawing.

DESCRIPTION OF THE PREFERRED EMBODIMENTS

The floating gate type non-volatile semiconductor memory according to the present invention will be described with respect to its structure, memory writing method, reading method and erasing method, in accordance with the drawings.

Figure 1:
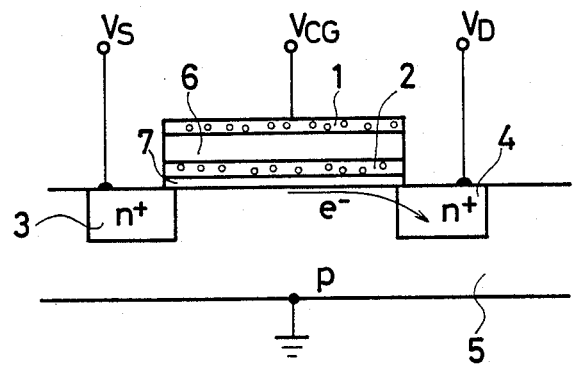
FIG. 1 is a sectional view showing an embodiment of a conventional non-volatile semiconductor memory, FIG. 2(a), FIG. 3, FIG. 4 and FIG. 5 respectively show embodiments of a non-volatile semiconductor memory according to the present invention.
Figure 2A:
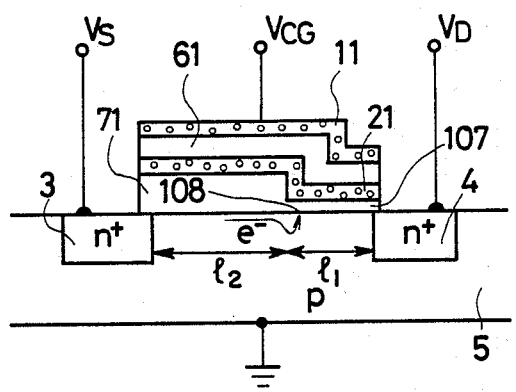
FIG. 2(b) shows a two dimension potential distribution diagram on a channel surface for illustrating the writing princiople of the non-volatile semiconductor memory of FIG. 2(a)

FIG. 2(a) shows a sectional view of an embodiment of a non-volatile semiconductor memory according to the present invention. An N+ type source region 3 and drain region 4 are formed near the surface of a P type semiconductor substrate 5, and a gate insulator having different thicknesses (the static capacitance per unit area is different) is formed on a channel region between the source region and drain region.

In the embodiment of FIG. 2(a), a thin insulator 107 is formed on the channel region portion l$_1$ in contact with the drain region 4 and a thicker insulator 71 is formed on the remaining channel region not portion l$_2$ in contact with the drain region 4. The static capacitance per unit area of the gate insulator 107 on the channel region portion l$_1$ in contact with the drain region 4 is larger than the static capacitance per unit area of the gate insulator 71 on the remaining channel region portion l$_2$.

When the gate insulators are of the same material (e.g. silicon dioxide) as shown in the embodiment of FIG. 2(a), the thickness of the gate insulator 107 is made thinner than the thickness of the gate insulator 71. Although not shown, gate insulators having different dielectric constants can be used. For example, the gate insulator 107 may be formed of a nitride layer and the gate insulator 71 may be formed of silicon dioxide layer. A floating gate electrode 21 (generally a polysilicon) is formed on the gate insulators 71 and 107, and a control gate electrode 11 is formed on the floating gate electrode 21 via a gate insulator 61. The gate insulator 71 meets the gate insulator 107 at a position more distant from the drain region than the width of the depletion layer formed between the substrate 5 and the N+ region under the drain region 4, as viewed from the drain region.

The method of injecting electrons into the floating gate 21 in the non-volatile semiconductor memory, embodying the present invention in FIG. 2(a), will be illustrated in conjunction with FIG. 2(b).

FIG. 2(b) shows a potential distribution diagram of the silicon dioxide layer in the case the where impurity density of the substrate 5 is $5 \times 10^{16}$ atoms cm$^{-3}$, the thickness of the gate insulators 71 and 107 are respectively 800 Å and 60 Å and the electric potential of the floating gate electrode 21 and the drain region 4 is 6 V. As understood from FIG. 2(b), a sharp potential slope is formed on the semiconductor surface where the gate insulator 71 meets the gate insulator 107. Namely, the surface potential $\phi SS$ of the channel region portion $l_1$ under the gate insulator 71 rapidly changes at the portion 108 in contact with the surface potential $\phi SD$ of the channel region under the gate insulator 107.

The electrons which flow from the source region 3 are accelerated by the electric field having the difference of surface potential $\Delta\phi S(=\phi SD-\phi SS)$ between the source and the drain. When the difference of the surface potential $\Delta\phi S$ is larger than the difference of the work function $\phi C$ between the silicon substrate 5 and the gate insulator 107, a part of the electrons flowing from the source region can enter into the floating gate electrode 21 from the region 108. In case the gate insulator 107 is of silicon dioxide, the work function, $\phi C=3.7$ V. Accordingly, a part of the channel current is injected into the floating gate electrode 21 by applying the drain voltage VD and the control gate voltage VCG of $\Delta\phi S > 3.2$ V. Since the electron acceleration electric field produced by the difference $\Delta\phi S$ between the surface potential of the channel region under the gate insulator 71 and the surface potential of the channel region under the gate insulator 107 includes the component directed from the silicon substrate 5 to the floating gate electrode 21, a part of the electrons directed toward to the drain are accelerated and injected into the floating gate. Therefore the injection efficiency relative to the channel current is between $10^{-7}$ and $10^{-4}$. Since the drain region 4 of lower energy level relative to the accelerated electrons is positioned apart from the injection region 108, the electrons are injected into the floating gate electrode more easily.

As illustrated, the injection method according to the present invention enables the non-volatile semiconductor memory device to write information: (1) at a low current; (2) at a low voltage; and (3) in a short time. As described hereinabove, such is achieved by constructing the device so as to satisfy the two relations $$V_{T1} < V_{T2} \tag{1}$$

$$\phi C < \Delta\phi S. \tag{2}$$

FIG. 2(a) is a sectional view showing an embodiment of the present invention, in which the control gate electrode 11 controls the electric potential of the floating gate electrode 21. The drain region 4 can also serve as the control gate electrode 11.

Figure 3:
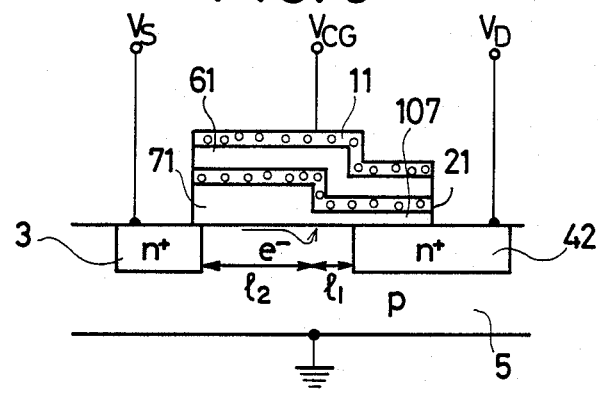

FIG. 3 is a sectional view showing an embodiment of the present invention, in which a drain region 42 controls the electric potential of the floating gate electrode 21 in a similar manner as the control gate electrode 11. Namely the electric potential $V_F$ of the floating gate electrode is controlled by the drain voltage $V_D$. Further the drain region 42 can serve completely as the control gate electrode 11, as the case may be.

Figure 5:
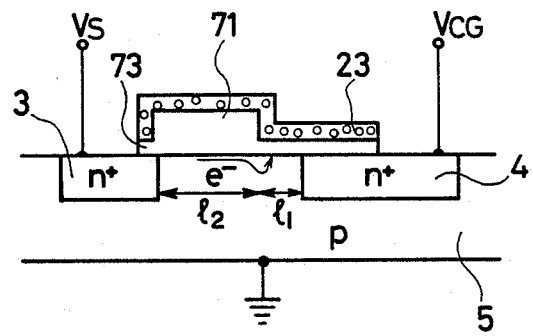

The drain region 4 also serves as the control gate electrode in the embodiment of FIG. 5. As shown in the sectional view of FIG. 5, which is an embodiment of the present invention, the drain region 4 largely overlaps with the floating gate electrode 23 to strengthen the capacitance coupling of the drain region 4 with the floating gate electrode 23, whereby the floating gate voltage $V_F$ is controlled by the drain voltage $V_D$.

The methods of erasing electrons from the floating gate electrode will now be illustrated. The methods of erasing electrons from the floating gate electrode can be roughly classified into two types. One method comprises exciting the electrons in the floating gate electrode by irradiation with ultraviolet rays and to cause the electrons to escape to the silicon substrate. The other method is to erase the electrons electrically.

The non-volatile semiconductor memory according to the present invention is able to be erased with ultraviolet rays in the same manner as the conventional type so that this erasing method need not be further described. Accordingly, the structure and method of erasing electrons electrically will be illustrated in conjunction with the drawings.

A memory having the structure shown in FIG. 2(a) can be electrically erased by erasing the electrons in the floating gate electrode to the drain region 4. When a voltage, by which the channel region between the source and drain region is not reversed, is applied as the control gate voltage VCG, and when an erasing voltage is applied to the drain voltage as $V_E$, a strong electric field created by the erasing voltage $V_E$ is applied to the thin gate insulator 107 between the floating gate electrode 21 and the drain region 4. The strong electric field applied to the thin gate insulator 107 causes a tunnel current to flow. Namely, the electrons in the floating gate electrode 21 can be erased by escaping to the drain region 4. When the electrons have escaped to the drain region 4 and the electric potential in the floating gate electrode 21 is higher, the tunnel current is cut down.

On this occasion, the erasing voltage can be reduced if the capacitance coupling of the control gate electrode 11 with the floating gate electrode 21 is strong and the capacitance coupling of the drain region 4 with the floating gate electrode 21 is weak. When the thin layer of the thin gate insulator 107 is 80 Å, the electrons can be erased by an erasing voltage $V_E = 8$ V.

Figure 4:
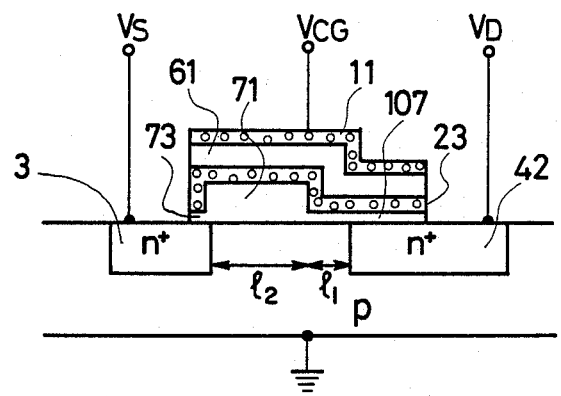

A memory having the structure according to the present invention shown in FIG. 4 is an embodiment which can be electrically erased by erasing the electrons in the floating gate electrode to the source region 3. When voltages which do not invert the channel region between the source region and the drain region are respectively applied to the control gate electrode 11 and the drain region 42 and when the erasing voltage $V_E$ is applied to the source region 3, a strong electric field created by the erasing voltage $V_E$ is applied to a thin insulator 73 which extends between a floating gate electrode 23 and the source region 3. The strong electric field applied to the thin insulator 73 causes a tunnel current to flow, and the electrons in the floating gate electrode 23 escape to the source region 3 to be erased. In this case, the capacitance coupling of the floating gate electrode 23 with the control gate electrode 11 or with the drain region 42 is strong, and the capacitance coupling with the source region 3 is weak. When the thin insulator 73 is a silicon dioxide layer of 80 Å, the electrons are erased when the erasing voltage $V_E = 8$ V. As for the memory shown in FIG. 4 in which the electrons escape to the source region 3, if the voltage is not applied to the source region 3 during the memory reading period, the electric field applied to the thin insulator 73 is weak. As a result, the memory retention time is prolonged.

A method of reading the non-volatile semiconductor memory according to the present invention will now be illustrated.

In a memory having the structure shown in FIG. 2(a), when a reading voltage higher than the source voltage by $V_R$ is applied to the control gate electrode 11, the channel region between the source region and the drain region assumes either a reverse or non-reverse condition depending on the amount of electrons in the floating gate electrode 21. It is hard to reverse the channel region reversed when the number of electrons in the floating gate electrode 21 is large, while the channel region is easily reversed when the number of electrons in the floating gate electrode 21 is small. Therefore, when a voltage which is positive relative to the source region 3 is applied to the drain region 4, the channel current flows in response to the amount of electrons in the floating gate electrode 21. In this manner, the memory can be read according to the amount of the channel current.

In case of in which shown in FIG. 5 (the structure the drain region 4 also serves as the control gate electrode), when the reading voltage VR is applied to the drain region, the channel current flows in response to the amount of electrons in the floating gate electrode 23 and the memory can be read.

In the non-volatile semiconductor memory according to the present invention, the reverse voltage (the threshold voltage) of the channel region on the source region side (the channel region under the gae insulator 71) is higher since the static capacitance at the gate insulator 71 is small. This causes the reading voltage $V_R$ of the memory to become higher, and such is not preferable from the standpoint of using the memory.

Figure 6A:
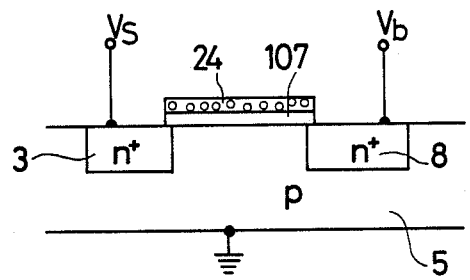
FIG. 6(a) is a sectional view taken on line B—B′ of FIG. 6(b)
Figure 6B:
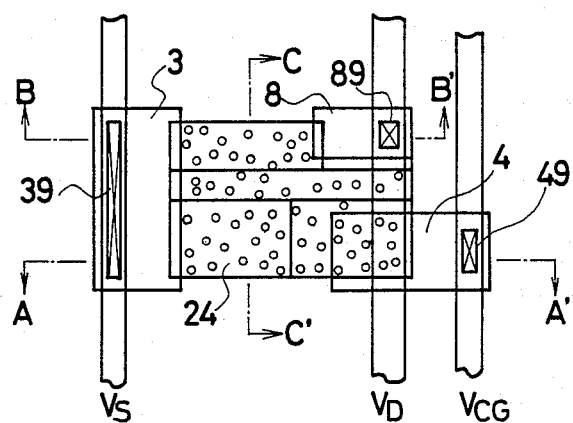
FIG. 6(b) is a plan view of a non-volatile semiconductor memory showing another embodiment of the present invention.
Figure 6C:
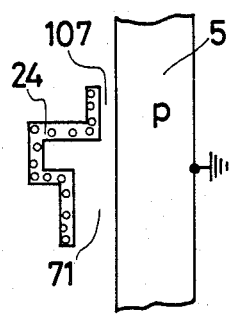
FIG. 6(c) is a sectional view taken on line C—C′ of FIG. 6(b) and FIG. 6(d) is a sectional view taken on line A—A′ of FIG. 6(b).
Figure 6D:
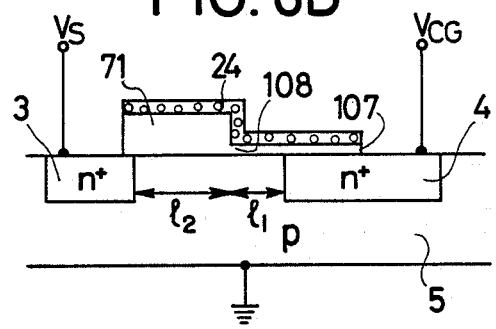

FIGS. 6(a) and 6(b) show an embodiment of the present invention, in which the reading voltage $V_R$ is reduced. FIG. 6(a) is a sectional view taken on line B—B' of the plan view of FIG. 6(b), FIG. 6(c) is a sectional view taken on line C—C' of FIG. 6(b), and FIG. 6(d) is a sectional view taken on line A—A' of FIG. 6(b). An injecting portion and a reading portion exist in the non-volatile semiconductor memory according to the present invention shown in FIG. 6. The injecting portion and the reading portion are formed by extending the floating gate of the reading transistor having the reading portion of low threshold voltage (the capacitance per unit area of the gate insulator is large), and drain electrode 8 for reading is newly provided.

The gate insulator 107 on the channel region between the source region 3 and the drain electrode 8 is thinner than that of the other gate insulator 71. The threshold voltage of the channel region between the source region 3 and the drain electrode 8 relative to the floating gate electrode 24 is lower than that of the other channel region (the channel under the gate insulator 71.) Namely the amount of the electrons in the floating gate electrode 24 can be detected (read) with a relatively low reading voltage $V_R$. The electrons are injected into the floating gate electrode 24 at a region 108 spaced at some distance from the drain region 4 which also serves as the control gate, and at a location where the gate insulator 71 meets the gate insulator 107 in the same way as in the other embodiments of the present invention.

While the drain region 4 serves also as the control gate electrode in the embodiment of the present invention shown in FIG. 6, it is to be noted that the control gate is separately provided. While a thin insulator is used as the gate insulator 107 to reduce the threshold voltage of the reading transistor in the embodiment of the present invention shown in FIG. 6, an insulator of high dielectric constant is more preferable. Further, it is possible to reduce the threshold voltage of the reading transistor by lowering the densisty of the reading transistor substrate (channel ions can be injected).

As illustrated, the injection efficiency of the non-volatile semiconductor memory according to the present invention is about 1000 times as high as the conventional memory, because the region where the electrons are injected to the floating gate electrode is more distant from the drain region than in the conventional memory, and because the direction of the electric field for accelerating the electrons is almost the same as the direction of the electrons which are injected into the floating gate. Accordingly the non-volatile semiconductor memory according to the present invention is able to write: (1) at a lower voltage; (2) at a lower current; and (3) at a high speed than the conventional type.

While the N-type memory has been illustrated by way of an embodiment of the present invention, it is to be noted that the present invention may be applied to the P-type memory. Further, the silicon substrate many be a semiconductor formed on an insulator.

What we claim is:

1. A non-volatile semiconductor memory device comprising: a semiconductor substrate of one conductivity type; a source region and a drain region both of another conductivity type and disposed in spaced apart relation adjacent the surface of the substrate to define in the substrate a channel region having a first channel portion in contact with the drain region and a second channel region portion between the first channel region portion and the source region; a floating gate electrode on the channel region and extending between the source region and the drain region; a gate insulating layer disposed between the channel region and the floating gate electrode, the gate insulating layer having first and second insulating regions formed respectively on the first and second channel region portions such that the capacitance per unit area of the first insulating region is larger than the capacitance per unit area of the second insulating region;

and means for applying a writing drain voltage of one polarity to the drain region to flow a channel current between the drain and source regions and for applying by capacitance coupling a writing floating gate voltage of said one polarity to the floating gate electrode so as to satisfy the following relation $$\phi C < \Delta \phi S$$

where
$\phi C$ represents the work function difference between the semiconductor substrate and the gate insulating layer, and ΔφS represents the surface potential difference between the first and second channel region portions in order to more strongly invert the first channel region portion and more weakly invert the second channel region portion relative to one another to effect the injection of electric charges which comprise part of the channel current into the floating gate electrode from a position where the first channel region portion under strong inversion is in contact with the second channel region portion under weak inversion, the position being more distant from the drain region than the width of a depletion layer under the drain region formed between the drain region and the semiconductor substrate.

2. A non-volatile semiconductor memory device as claimed in claim 1; including a control gate electrode formed on the floating gate electrode; a second gate insulating layer disposed between the control gate electrode and the floating gate electrode; and wherein the means for applying includes means for applying a voltage of said one polarity to said control gate electrode to apply by capacitance coupling a writing floating gate voltage to the floating gate electrode.

3. A non-volatile semiconductor memory device as claimed in claim 1; wherein the first and second insulating regions are both comprised of the same material.

4. A non-volatile semiconductor memory device as claimed in claim 1; wherein the first and second insulating regions are each comprised of a different material.

* * * * *